United States Patent [19]

Vranish

[11] Patent Number: 5,442,347
[45] Date of Patent: Aug. 15, 1995

[54] DOUBLE-DRIVEN SHIELD CAPACITIVE TYPE PROXIMITY SENSOR

[75] Inventor: John M. Vranish, Crofton, Md.

[73] Assignee: The United States of America as represented by the Administrater, national Aeronautics & Space Administration, Washington, D.C.

[21] Appl. No.: 8,426

[22] Filed: Jan. 25, 1993

[51] Int. Cl.⁶ .............................................. G08C 19/10
[52] U.S. Cl. ................... 340/870.37; 340/562; 324/686; 324/687
[58] Field of Search ........... 340/870.3, 870.37, 562, 340/563, 564; 324/660, 661, 662, 686, 687, 688, 690

[56] References Cited

U.S. PATENT DOCUMENTS

| | | | |
|---|---|---|---|
| 3,829,850 | 8/1974 | Guetersloh | 340/563 |
| 4,063,447 | 12/1977 | Mathison | 340/563 |
| 4,295,740 | 10/1981 | Surges, Jr. | 356/152 |
| 4,658,385 | 4/1987 | Tsuji | 367/105 |
| 4,776,369 | 10/1988 | Lardner et al. | 137/515.5 |
| 4,845,421 | 7/1989 | Howarth et al. | |
| 5,125,601 | 6/1992 | Monford, Jr. | 244/161 |
| 5,134,379 | 7/1992 | Maher et al. | 324/663 |
| 5,166,679 | 11/1992 | Vranish | 340/870.37 |
| 5,214,388 | 5/1993 | Vranish et al. | 340/870.37 |
| 5,247,281 | 9/1993 | Facon et al. | 340/562 |

Primary Examiner—John K. Peng
Assistant Examiner—Daniel J. Wu
Attorney, Agent, or Firm—R. Dennis Marchant; Guy M. Miller

[57] ABSTRACT

A capacity type proximity sensor comprised of a capacitance type sensor, a capacitance type reference, and two independent and mutually opposing driven shields respectively adjacent the sensor and reference and which are coupled in an electrical bridge circuit configuration and driven by a single frequency crystal controlled oscillator. The bridge circuit additionally includes a pair of fixed electrical impedance elements which form adjacent arms of the bridge and which comprise either a pair of precision resistances or capacitors. Detection of bridge unbalance provides an indication of the mutual proximity between an object and the sensor. Drift compensation is also utilized to improve performance and thus increase sensor range and sensitivity.

18 Claims, 5 Drawing Sheets

DOUBLE-DRIVEN SHIELD CAPACITIVE TYPE PROXIMITY SENSOR

ORIGIN OF THE INVENTION

This invention was made by an employee of the United States Government and accordingly may be manufactured and used by or for the Government for governmental purposes without the payment of any royalties thereon or therefor.

BACKGROUND OF THE INVENTION

1. Field of the Invention

The present invention relates generally to capacitive type proximity sensors and more particularly to a capacitive type "capaciflector" proximity sensor which includes a driven shield element behind the sensor.

2. Description of the Prior Art

Capacitive sensors used for proximity sensing and collision avoidance are generally known. However, such sensors do not adequately control stray capacitance and consequently do not perform with an adequate range and sensitivity for many applications such as docking and berthing in outer space.

In U.S. Pat. No. 5,166,679, entitled "Driven Shielding Capacitive Proximity Sensor", John M. Vranish which issued Nov. 24, 1992, the teachings of which are incorporated herein by reference, there is disclosed a capacitive sensing element which uses a capacitively controlled oscillator to drive the sensor element as well as a voltage follower driven shield member located behind the sensor element to reflect energy toward an intruding object to substantially increase range and sensitivity. The intruding object forms an additional capacitive path to ground which in turn alters the frequency of the oscillator. This frequency change is converted to a DC output signal by a frequency to voltage converter.

Such a proximity sensor, however, includes several inherent limitations which include, for example: the central frequency of the oscillator tends to drift as a function of changes in temperature and humidity; the frequency to voltage converter is relatively large in size and consumes a substantial amount of power; and the components and their connections as well as the arrangements in front of a relatively high gain output amplifier presents a source of low frequency drift, and since the signal output is in the low frequency region, this has a tendency to reduce sensor range and sensitivity.

SUMMARY

It is an object of the present invention, therefore, to provide an improvement in capacitive type proximity sensors.

It is a further object of the invention to provide an improvement in capacitive type proximity sensors which include a driven shielding member.

It is still another object of the invention to provide a proximity sensor which will sense the proximity of humans or unexpected structures at a range sufficient to provide collision avoidance such as during docking and berthing operations in outer space.

It is yet another object of the invention to provide a proximity sensor which can be used to determine the location of pins, holes and edges in equipment with sufficient accuracy to permit alignment prior to docking and berthing.

And it is still yet another object of the invention to provide an improvement in proximity sensors which will permit machines and/or astronauts to guide payloads precisely into latching devices and to anticipate touchdown just prior before it occurs so as to permit a very soft mating process during a docking and berthing procedure in outer space.

Briefly, the foregoing and other objects are achieved by a capacity type proximity sensor comprised of a capacitance type sensor, a capacitance type reference, and two independent and mutually opposing driven shields respectively adjacent the sensor and reference and which are coupled in a bridge circuit configuration and driven by a single frequency crystal controlled oscillator. The bridge circuit additionally includes a pair of fixed electrical impedance elements which form adjacent arms of the bridge and which comprise either a pair of precision resistances or capacitors. Detection of bridge unbalance provides an indication of the mutual proximity between an object and the sensor. Drift compensation is also utilized to improve performance and thus increase sensor range and sensitivity.

BRIEF DESCRIPTION OF THE DRAWINGS

The following detailed description of the invention will be more readily understood when considered together with the accompanying drawings in which.

DETAILED DESCRIPTION OF THE INVENTION

Figure 1:
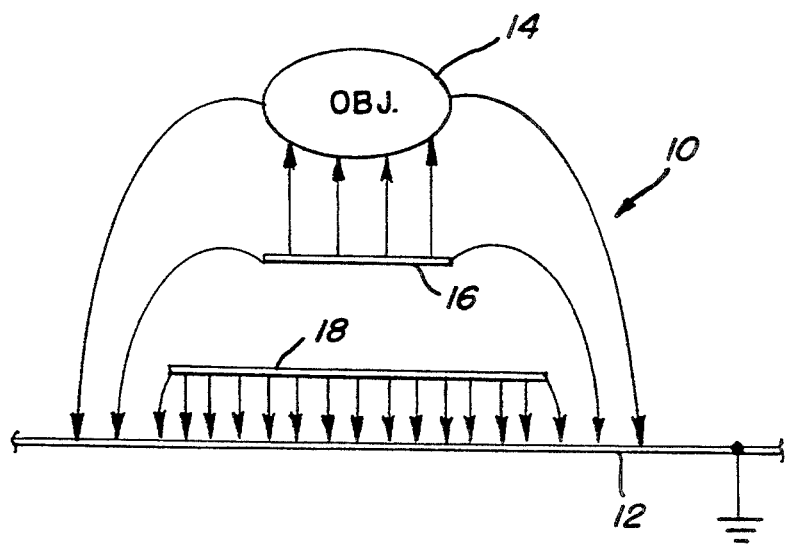
FIG. 1 is a diagram illustrating the electric field distribution of a capacitance type proximity sensor in accordance with the known prior art.

Referring now to the drawings and more particularly to FIG. 1, shown thereat is an electrical field distribution system of a driven shield capacitance type sensor, also referred to as a "capaciflector" sensor which is shown and described in detail in above referenced U.S. Pat. No. 5,166,679. In such a sensor system, a piece of apparatus 12 which may be, for example, the skin of a robotic arm and which is to be protected from the presence and position of an intruding object 14, includes a sensor element 16 which comprises a thin sheet of conductive material which is driven by an electronic circuit, not shown, and which acts as one electrode of a capacitor, the second electrode of which is provided by the intruding object 14. The capacitor thus formed controls the frequency of an oscillator, also not shown, which operates so that when an object for some reason or another intrudes, the output frequency of the oscillator changes. The grounded objects in the vicinity of the conductor sheet 16 and the lead wires between the circuit and the sheet 16 create a large fixed parasitic capacitance which reduces sensor sensitivity to the intruding object 14.

To increase the sensitivity of the capacitance type proximity sensor by reducing the parasitic capacitance exhibited by the electric field shown in FIG. 1, the prior art system shown and described in U.S. Pat. No. 5,166,679 provides for the insertion of a second relatively thin sheet 18 of conductive material which is substantially wider than the sensor 16 and is located between the sensor 16 and the apparatus being protected 12. This generates an electric field distribution such that the member 18 acts as a shield for the capacitive sensor 16 where the field concentration is centered between it and the object 14, with a substantially smaller field returning directly to the grounded apparatus 12.

The shield member 18, furthermore, is driven at the same instantaneous voltage as the capacitor sensor 16, however, it is not frequency sensitive to nearby objects as is the sensor 16. Thus the sensor 16 is shielded from nearby ground, i.e. the apparatus 12, such that the capacitance between it and the arm is substantially reduced.

Figure 2:
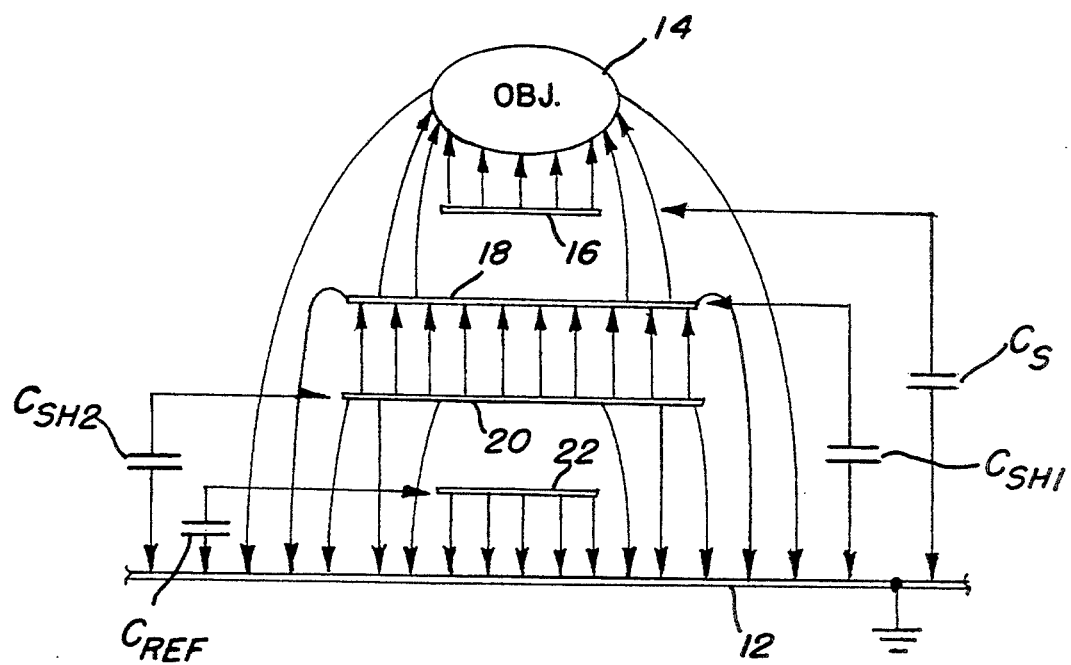
FIG. 2 is a diagram illustrative of the electrical field distribution of a proximity sensor in accordance with the present invention.

Referring now to FIG. 2, shown thereat is an improvement in the driven shield configuration of FIG. 1 and comprises a double driven shield configuration which includes a second shield 20, also comprised of a relatively thin sheet of conductive material, located beneath the shield 18 and above the apparatus being protected 12. Also, there is a reference sensor element 22, similar to or identical to the thin sheet of conductive material forming the sensor element 16, located intermediate the second shield member 20 and the apparatus 12. The second shield member 20 isolates the reference sensor 22 from the field of interest and is unaffected by the intrusion of the object 14 into the field of interest.

Referring now to FIGS. 3A through 3D, there is disclosed the capacitive components of $C_s$, $C_{sh1}$, $C_{sh2}$ and $C_{ref}$ associated with the sensor 16, the first shield member 18, the second shield member 20, and the reference sensor 22, respectively.

Figure 3A:
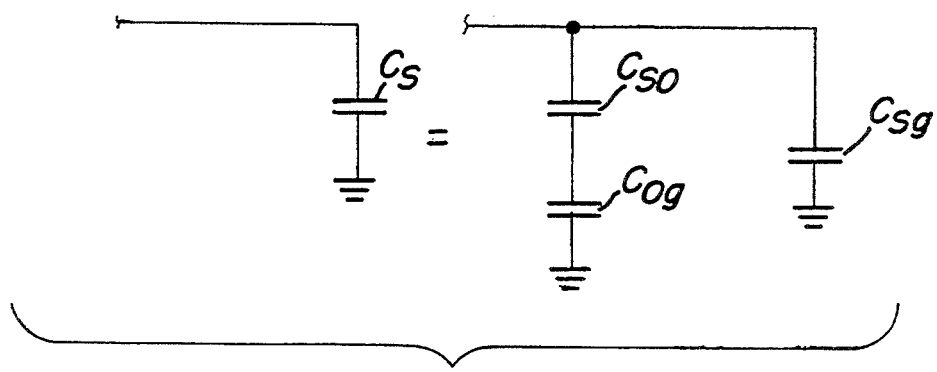
FIGS. 3A–3D depict a set of equivalent circuits for the capacitance elements shown in FIG. 2.
Figure 3B:
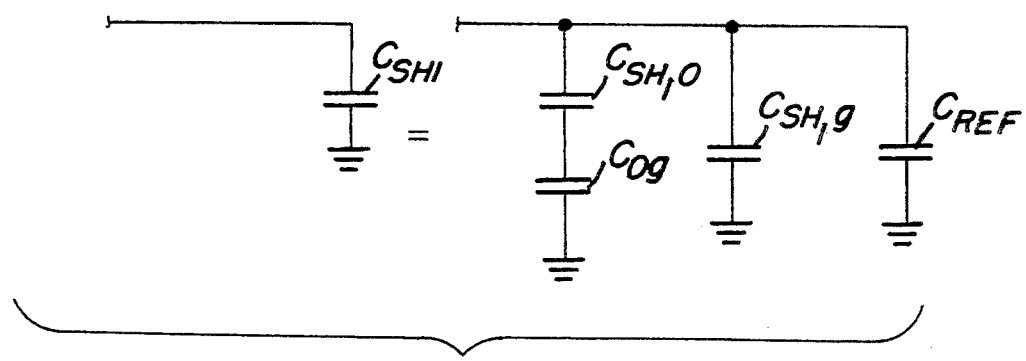
Figure 3C:
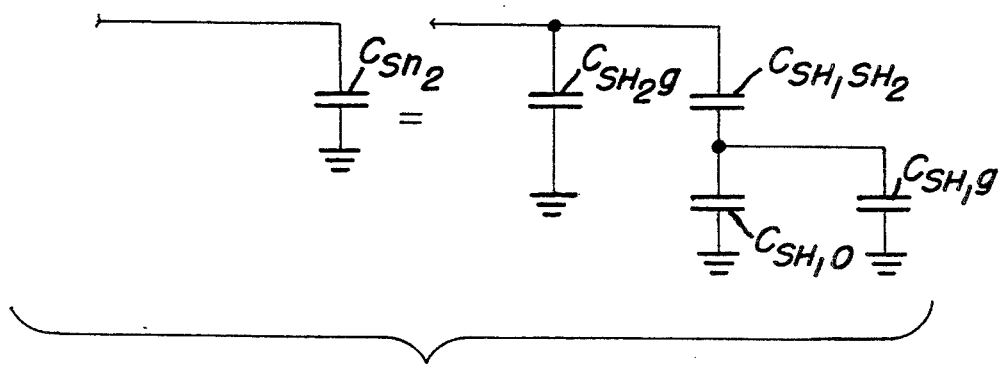
Figure 3D:
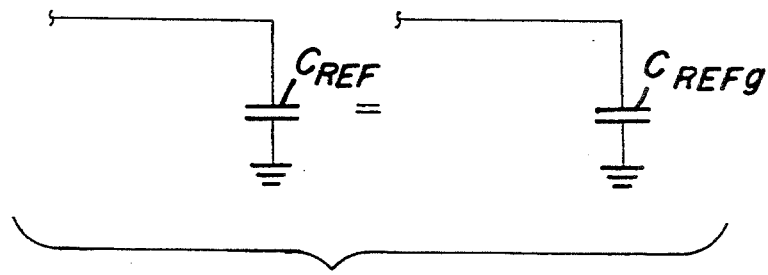

With respect to the capacitance $C_s$, as shown in FIG. 3A, it is comprised of three capacitances, the capacitance $C_{so}$ connected in series to the capacitance $C_{og}$ which is shunted by the capacitance $C_{sg}$, where $C_{so}$ is the capacitance between the sensor 16 and the object 14, $C_{og}$ is the capacitance of the object 14 to ground and $C_{sg}$ is the capacitance between the sensor 16 and ground. As shown in FIG. 3B, the capacitance $C_{sh1}$ associated with the shield 18 is comprised of the series combination of $C_{sh1o}$ and $C_{og}$ shunted by capacitance $C_{sh1g}$ and $C'_{ref}$, where $C_{sh1o}$ comprises the capacitance between the shield 18 and the object 14, $C_{og}$ comprises a capacitance between the object 14 and ground, $C_{sh1g}$ is the capacitance of the shield 18 to ground and $C'_{ref}$ is a negative capacitance indicative of a current source for a bridge circuit arrangement shown in FIGS. 4-8, to be described. The second shield capacitance $C_{sh2}$, as shown in FIG. 3C, is the combination of four capacitances, the first being $C_{sh2g}$ which is shunted by a series combination of $C_{sh1sh2}$, and $C_{sh1o}$ with the latter being further shunted by the capacitance $C_{sh1g}$, where $C_{sh2g}$ comprises the capacitance between the second shield 20 and ground, $C_{sh1sh2}$ comprises the capacitance between the two shields 18 and 20, $C_{sh1o}$ comprises the capacitance between the first shield 18 and the object 14 and $C_{sh1g}$ comprises the capacitance between the first shield 18 and ground. Finally, $C_{ref}$ comprises a single capacitance as shown in FIG. 3D and comprises the capacitance between the reference element 22 and ground.

Figure 4:
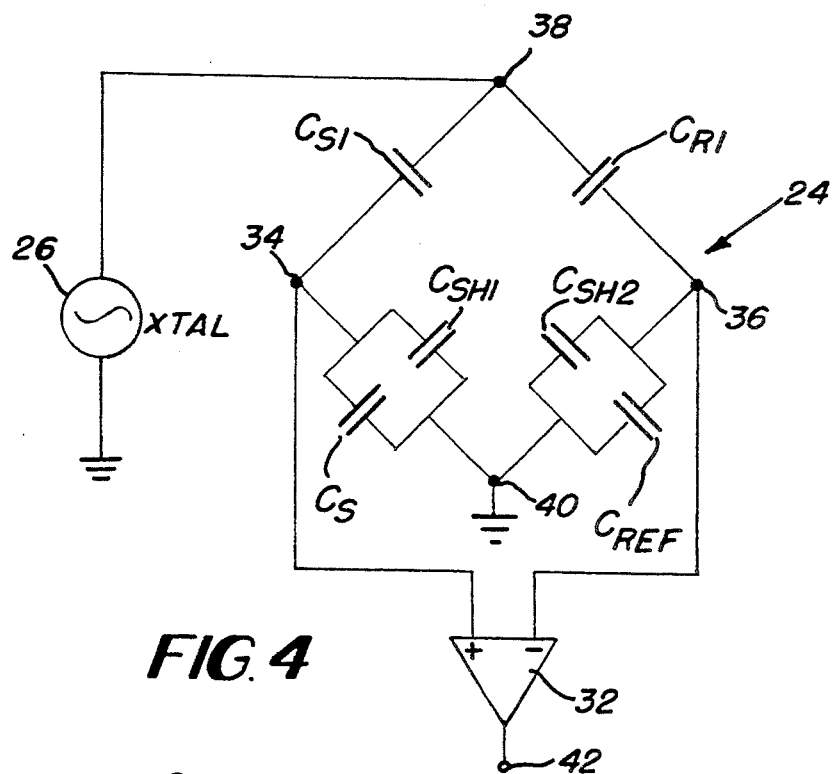
FIG. 4 is an electrical schematic diagram illustrative of the elements shown in FIG. 2 connected in a bridge configuration.

As shown in FIG. 4, the four elements 16, 18, 20 and 22 represented by their capacitances are connected in adjacent arms of a bridge circuit 24 which also includes a pair of fixed impedances represented by capacitances $C_{s1}$ and $C_{r1}$ in opposing adjacent arms. The bridge circuit is shown being energized by a single signal source 26 which comprises a crystal controlled oscillator. The crystal controlled oscillator 26 outputs a highly stable single frequency signal. Following bridge balance, intrusion by the object 14 into a region of interest in the vicinity of the sensor 16 forces the bridge 24 out of balance.

Figure 5:
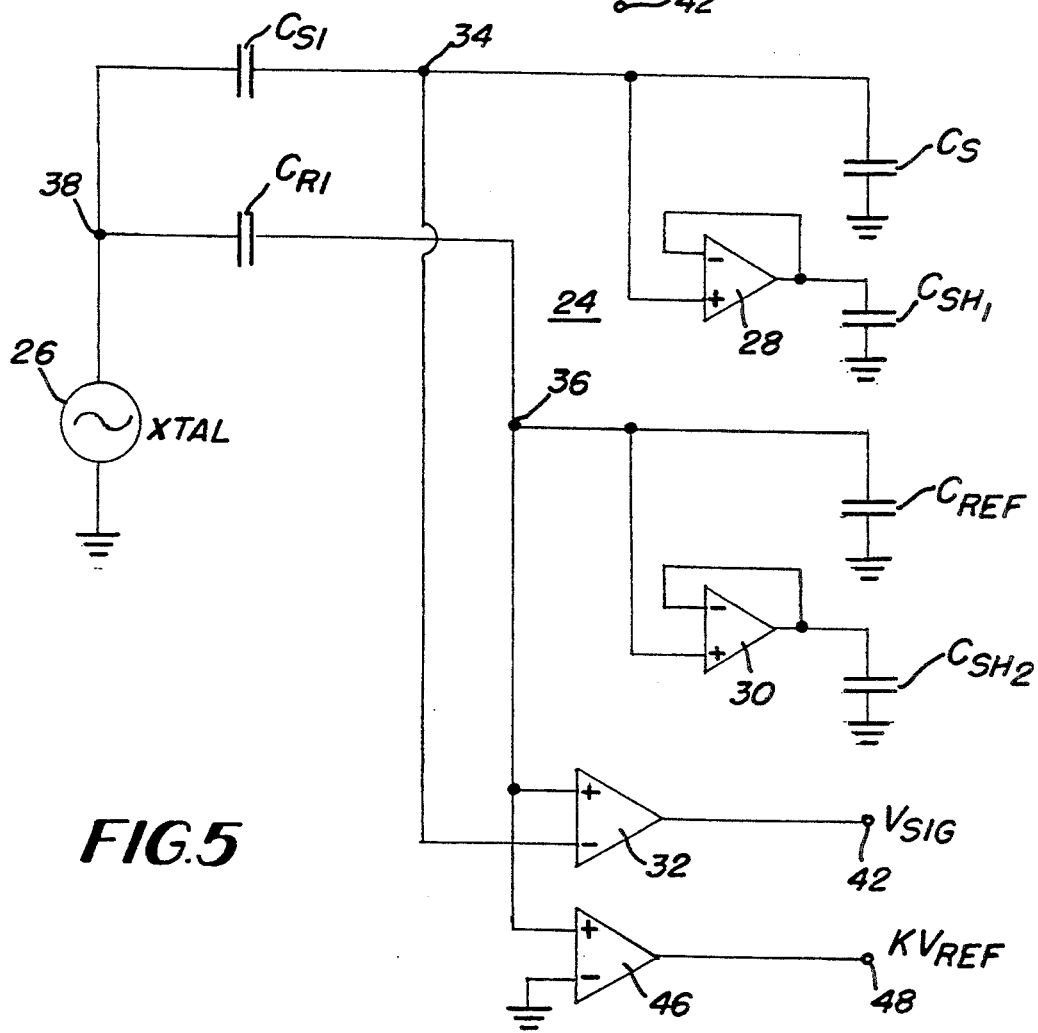
FIG. 5 is an electrical schematic diagram depicting a first preferred embodiment of the subject invention.

As illustrated in FIG. 5, there the bridge circuit 24 is redrawn in order to further disclose the inclusion of a pair of operational amplifiers configured to operate as high input impedance/low output impedance voltage follower circuits 28 and 30, which are coupled to the crystal controlled oscillator 26 through the capacitances $C_{s1}$ and $C_{r1}$ to drive the shields 18 and 20 (FIG. 2) forming the capacitances $C_{sh1}$ and $C_{sh2}$. Bridge balance is detected by means of a differential amplifier 32 coupled across the bridge circuit nodes 34 and 36 and where circuit node 38 common to the resistances $C_{s1}$ and $C_{r1}$ are connected to one side of the crystal oscillator 26, with circuit node 40 being connected to ground along with the opposite side of the crystal oscillator 26. The differential amplifier 32 provides a voltage signal output $V_{sig}$ at terminal 42.

In accordance with classic voltage divider bridge detection circuits, if the impedances of the capacitances $C_s$ and $C_{ref}$ are equal as well as the capacitive impedances of $C_{s1}$ and $C_{r1}$, then $V_{sig}=0$. As the sensor element 16 shown in FIG. 2 approaches an object 14, or vice versa, $C_s$ increases and with it the current across $C_{s1}$. This unbalances the bridge and increases $V_{sig}$. The closer the object 14 comes to the sensor 16, the larger $V_{sig}$ becomes.

Further as shown in FIG. 5, an operational amplifier 46 having one input grounded is coupled to the circuit node 36 and provides a reference voltage output of $KV_{ref}$ at terminal 48, where K is the amplification factor of amplifier 46. Because amplifier 46 is connected to the other side of the bridge 24, movement of the object 14 relative to the sensor 16 $V_{ref}$ is not affected. Upsetting the balance in the bridge means that $KV_{ref} > V_{sig}$. This, in turn, results in current leakage from the reflective shield 20 behind the reference element 22 to the reflective shield 18 behind the sensor element 16. However, the shield 20 behind the reference sensor 22 is slaved to the reference capacitance $C_{ref}$ by the voltage follower 30. The shield capacitance $C_{sh1}$ is similarly slaved to the capacitance of the sensing element $C_s$ via the voltage follower circuit 28. Thus any leakage current cannot affect either $V_{ref}$ or $V_{sig}$, thus enhancing performance.

It is to be noted that $KV_{ref}$ is precisely defined throughout all operations. Ground is made an integral part of the structure by virtue of the apparatus 12 being grounded and is precisely located with respect to the capacitance $C_{ref}$ and its reflecting shield capacitance $C_{sh2}$. The second shield element 20 isolates the reference element 22 from the effects of the object 14 and the sensor 16 and thus $KV_{ref}$ is clearly defined no matter how the system is mounted and no matter what is occurring with respect to the relative position of the sensor 16 and the object 14.

The circuit elements are specifically designed to compensate for any changing environment, such as by selecting precision capacitors with like characteristics for the capacitances $C_{s1}$ and $C_{r1}$ and being located next to one another so that they are subject to the same variations in temperature. The amplifiers 28, 30, 32 and 46 are also co-located on a common printed circuit board and become part of a common structure which is equally affected by the changing environment.

It is also to be noted that the circuitry shown in FIG. 5 also provides a technique for drift measurement and is accomplished by locating the output amplifier 32 adjacent the amplifier 46. Since the main source of drift would be temperature induced variations in the components, the gain K of amplifier 46 is measured at the start of an operation and is given a value $K_0$. Since $C_{ref}$ and $C_{r1}$ changes relatively little during operation, particularly if the reference currents are kept low, any observed variation in the output of $KV_{ref}$ will be caused by a variation of gain K in the high gain amplifier and thus provide a measure of drift.

While the circuitry shown in FIGS. 4 and 5 disclose the concept of a simple differential amplifier 32 for detecting any change in the bridge circuit 24, the concept of peak detection can also be utilized when desirable, and comprises a preferred method of detection. This method merely requires the addition of a pair of peak detectors to the bridge output terminals. Accordingly, a pair of peak detector circuits 50 and 52, as shown in FIG. 6, are coupled to the bridge circuit nodes 34 and 36, with the output to the peak detectors 50 and 52 then being fed to the two inputs of the differential amplifier 32 as before.

Figure 7:
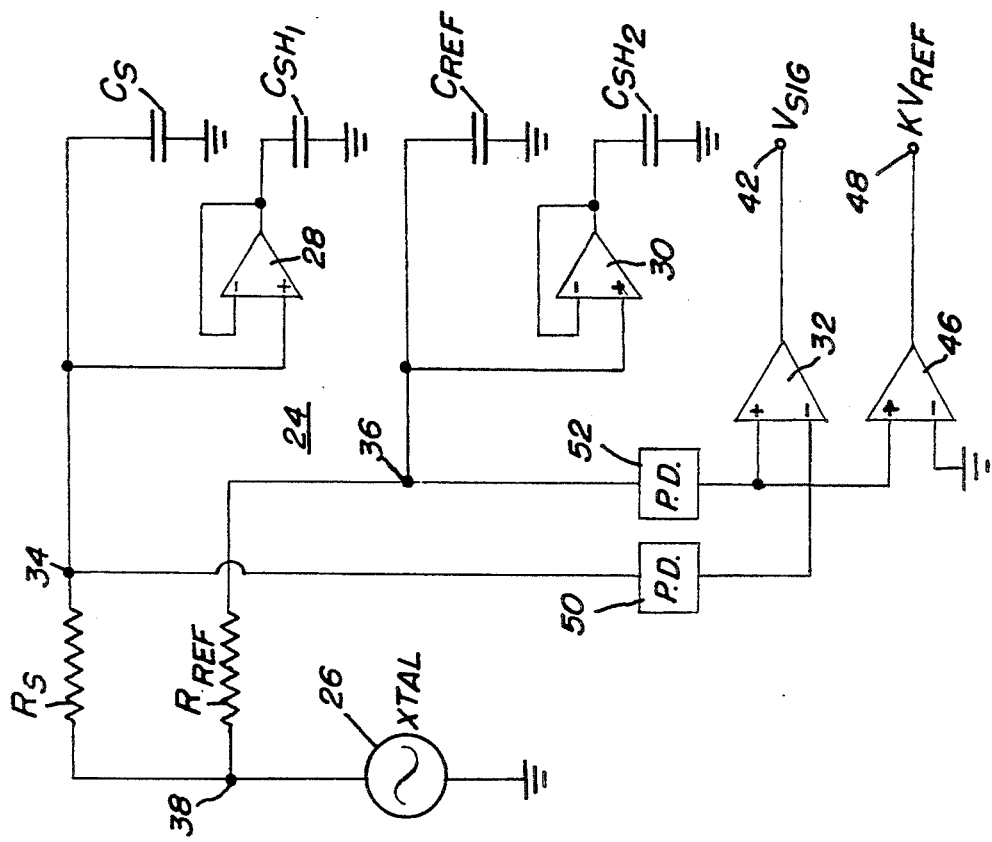
FIG. 7 is an electrical schematic diagram illustrative of a third preferred embodiment of the invention.

Referring now to FIG. 7 where there is shown another preferred embodiment of the invention, in addition to the peak detectors 50 and 52, the fixed capacitors in adjacent arms of the bridge 24 and comprising the capacitances $C_{s1}$ and $C_{r1}$ are replaced by precision resistors having fixed resistance values $R_s$ and $R_{ref}$, respectively. The trade off would be determined by the relative temperature characteristics of the capacitive components as opposed to resistive components in adjacent arms of the bridge, including the shielding elements and the sensor elements shown in FIG. 2.

Figure 6:
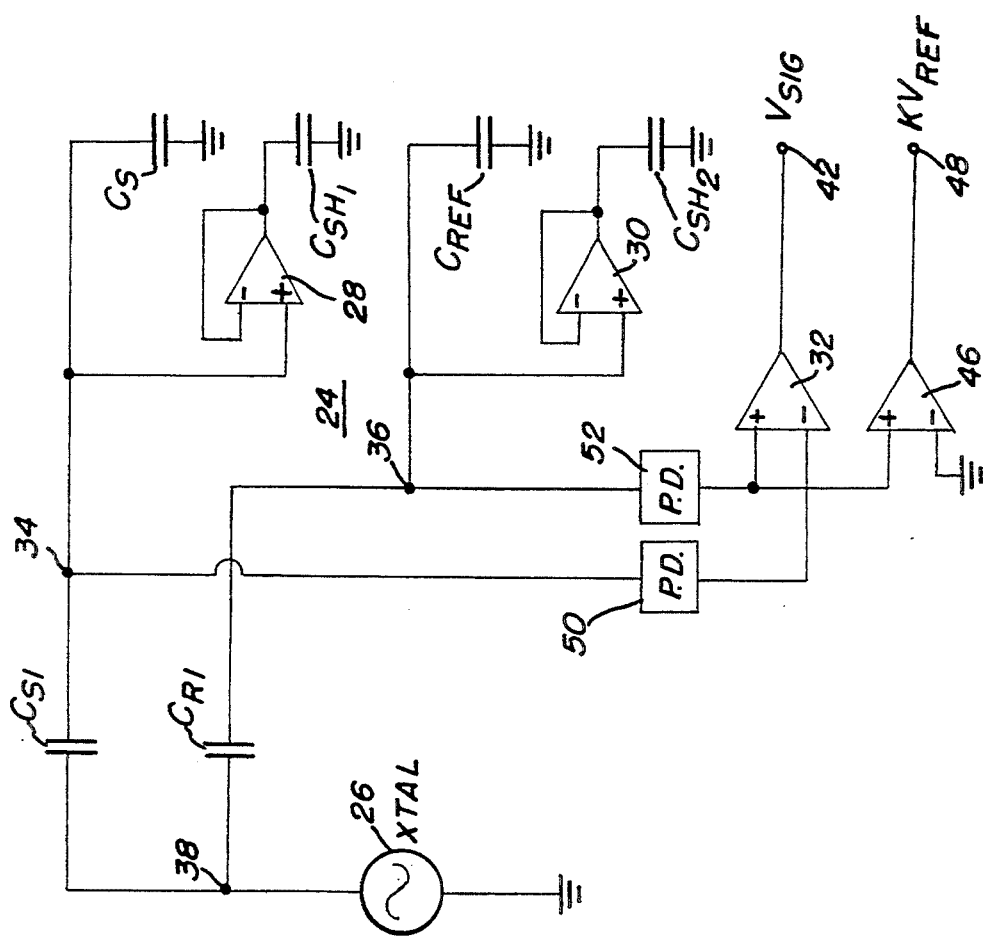
FIG. 6 is an electrical schematic diagram illustrative of a second preferred embodiment of the invention.
Figure 8:
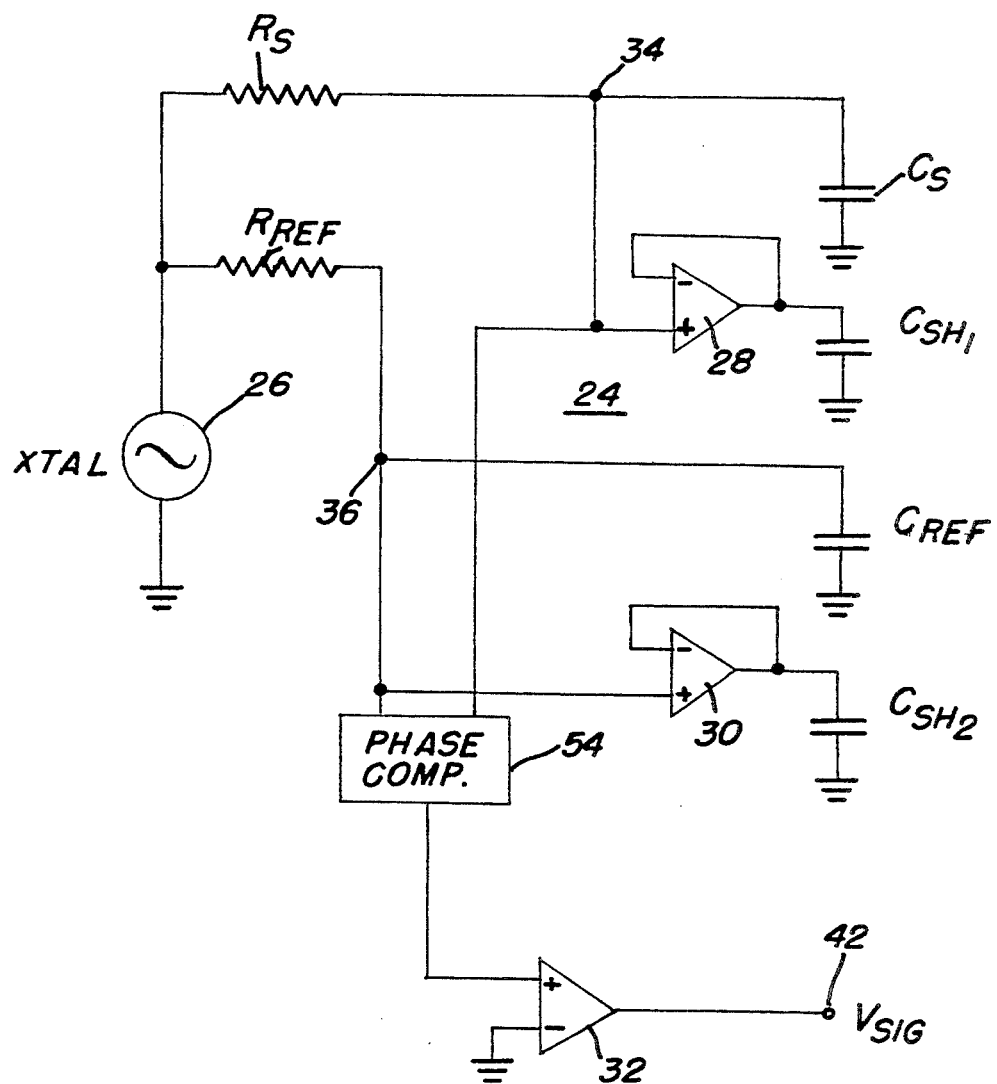
FIG. 8 is an electrical schematic diagram illustrative of a fourth preferred embodiment of the subject invention.

Also, phase discrimination can be used in place of peak detection, for example, as shown in the embodiment of FIG. 8, where a phase comparator 54 is utilized in place of the peak detectors 50 and 52, shown in FIG. 6. When desirable, the same substitution can be used for the embodiment shown in FIG. 6.

With respect to the selection of the capacitors or resistors for adjacent arms of the bridge 24 providing the impedances $R_{ref}$, $R_s$ and $C_{s1}$, $C_{r1}$, respectively, the fixed resistor arrangement shown in FIGS. 6 and 7 provide a bridge circuit which acts as a simple voltage divider, with both the left and right sides of the bridge being in phase no matter how large or how small the output signal. The capacitors can be built into the printed circuit board and thus make the sensor extremely compact with each component being mutually referenced with respect to the other.

Since a single frequency is utilized, frequency stabilized crystal controlled oscillators can be employed and became desirable because frequency drift over long periods of time is substantially reduced, thus permitting indefinite operation in space. This also permits narrow band filtering where required, which improves signal to noise and thus range and sensitivity.

The circuitry employed in the present invention becomes relatively simple inasmuch as the frequency to voltage conversion apparatus which consumes far too much power and typically utilized in the prior art is eliminated. In addition to eliminating the frequency to voltage converters, only a few elements are utilized and these comprise peak detectors, resistors and operational amplifiers which are relatively simple and compact. Capacitors, moreover, can be built into the printed circuit board and so are also extremely compact. Since all the components can be built into the same circuit board structure, these elements can be precisely located with respect to one another, thus drastically reducing parasitic capacitances and losses, while those that do remain are repeatable and predictable. Furthermore, drift minimization and control are easily implemented.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

I claim:

1. A double driven shield capacitive type proximity sensor located on a piece of apparatus for detecting the presence of an intruding object within a region of interest in the vicinity of the apparatus, comprising:

an outermost sensor element on said piece of apparatus and facing said object;

a first shield element for said outermost sensor element located immediately behind said outermost sensor element and between said piece of apparatus;

a reference sensor element located immediately adjacent said piece of apparatus and behind said first shield element;

a second shield element for said reference sensor element located intermediate said first shield element and said reference sensor element;

said outermost sensor element and said first shield element being coupled in parallel in a first arm of a bridge circuit also including first and second pairs of circuit nodes, said reference sensor element and said second shield element being coupled in parallel in a second arm of said bridge circuit, said first and second arms comprising a first pair of mutually adjacent arms of said bridge circuit and being connected at one end to a first node of said first pair of circuit nodes and being connected at their respective other ends to separate nodes of said second pair of circuit nodes, and additionally including first and second electrical impedance elements respectively comprising third and fourth arms of said bridge circuit, said third and fourth arms comprising a second pair of mutually adjacent arms of said bridge circuit and being connected at one end to a second node of said first pair of circuit nodes and being connected at their respective other ends to said separate nodes of said second pair of nodes thereby closing said bridge circuit;

a single frequency signal source coupled to said first pair of circuit nodes; and second circuit means coupled to said second pair of circuit nodes for detecting the state of balance of said bridge circuit, thereby providing an indication of intrusion by said object within said region of interest as a function of said state of balance.

2. The sensor of claim 1 and additionally including voltage follower circuit means coupled in series to said first and second shield elements in said first and second arms, respectively, of said bridge circuit.

3. The sensor of claim 2 wherein said single frequency signal source comprises a relatively stable oscillator signal source.

4. The sensor of claim 3 wherein said oscillator signal source comprises a crystal controlled oscillator.

5. The sensor of claim 1 wherein said pair of electrical impedance elements are comprised of resistance type elements.

6. The sensor of claim 1 wherein said pair of electrical impedance elements are comprised of a pair of fixed value precision type resistors.

7. The sensor of claim 1 wherein said pair of electrical impedance elements are comprised of capacitance type elements.

8. The sensor of claim 1 wherein said pair of electrical impedance elements are comprised of a pair of fixed value capacitors.

9. The sensor of claim 1 wherein said second circuit means includes differential output signal circuit means.

10. The sensor of claim 9 wherein said differential output signal circuit means comprises a differential amplifier including a pair of inputs respectively connected to said second pair of circuit nodes.

11. The sensor of claim 1 wherein said second circuit means includes peak detector circuit means.

12. The sensor of claim 11 wherein said peak detector circuit means includes first and second peak detectors respectively coupled to separate nodes of said second pair of circuit nodes and differential amplifier means including a pair of inputs respectively coupled to said first and second peak detectors and being responsive to the respective outputs thereof to generate a differential output signal indicative of bridge circuit balance.

13. The sensor of claim 12 wherein said second means additionally includes drift compensation circuit means.

14. The sensor of claim 13 wherein said drift compensation circuit means includes a dual input amplifier having one input connected to a point of reference potential and one input connected to one circuit node of said second pair of circuit nodes.

15. The sensor of claim 14 wherein said one circuit node is common to said reference sensor element.

16. The sensor of claim 1 wherein said second circuit means includes phase comparator circuit means coupled to said second pair of circuit nodes and generating a phase varying output signal as a function of balance of said bridge circuit.

17. The sensor of claim 1 wherein said outermost sensor element overlays said first shield element, said first shield element overlays said second shield element, and said second shield element overlays said reference sensor element.

18. The sensor of claim 1 and additionally including insulation between said outermost sensor element and said first shield element, insulation between said first shield element and said second shield element, insulation between said second shield element and said reference sensor element, and insulation between said reference sensor element and said piece of apparatus.

* * * * *